(12) United States Patent
Easwaran

(10) Patent No.: US 7,248,087 B2
(45) Date of Patent: Jul. 24, 2007

(54) COARSE DELAY TUNER CIRCUITS WITH EDGE SUPPRESSORS IN DELAY LOCKED LOOPS

(75) Inventor: Sri Navaneethakrishnan Easwaran, Zurich (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/538,378

(22) PCT Filed: Dec. 8, 2003

(86) PCT No.: PCT/IB03/05746

§ 371 (c)(1),
(2), (4) Date: Jun. 13, 2005

(87) PCT Pub. No.: WO2004/055988

PCT Pub. Date: Jul. 1, 2004

(65) Prior Publication Data

US 2006/0109038 A1    May 25, 2006

(51) Int. Cl.
*H03L 7/06* (2006.01)
(52) U.S. Cl. .................... 327/158; 327/149
(58) Field of Classification Search ........ 327/156–158, 327/147–149
See application file for complete search history.

(56) References Cited

U.S. PATENT DOCUMENTS

| | | | | |
|---|---|---|---|---|
| 5,845,572 A | * | 12/1998 | Cronin et al. | 101/123 |
| 5,920,221 A | * | 7/1999 | Shen et al. | 327/264 |
| 6,950,488 B2 | * | 9/2005 | Chung et al. | 375/376 |

* cited by examiner

*Primary Examiner*—Dinh T. Le

(57) ABSTRACT

The invention discloses a delay locked loop which includes a coarse delay tuner circuit with edge suppressors suitable for use with delay locked loops (DLLs). The disclosed tuner circuit provides reduced lock time of the DLL circuit.

14 Claims, 3 Drawing Sheets

COARSE DELAY TUNER CIRCUITS WITH EDGE SUPPRESSORS IN DELAY LOCKED LOOPS

The invention relates generally to a method and apparatus for a coarse delay tuner circuit with edge suppressors suitable for use with delay locked loops (DLLs).

A delay locked loop is an electronic circuit which can be used to match the internal clock of a synchronous integrated circuit device with an external clock, without error, i.e., to reduce so-called clock skew. By controlling the time delay of the internal clock relative to the external clock, the internal clock can be synchronized with the external clock. One important performance parameter of a delay locked loop is the lock time, or the time required for this synchronization to occur.

Accordingly, there exists a need for a delay tuner circuit which may be employed in DLLs for reducing the lock time.

It is therefore a feature of the present invention to overcome the above shortcomings related to DLL lock time circuits by providing a method and apparatus for a coarse delay tuner which provides reduced lock times. Such DLL lock time circuits may be found in, inter alia, semiconductor devices which include a synchronous memory component, and apparatus containing such circuits.

In a first general aspect, the present invention presents a coarse delay tuner circuit for use with delay locked loops, said coarse delay tuner circuit comprising: an input node for receiving an input signal, wherein said input signal is a clock signal; a triggering circuit, said triggering circuit operationally coupled to said input node, wherein said triggering circuit is adapted to condition said input signal and to provide a first output signal in response to a threshold level being reached by said input signal; an edge suppressor circuit operationally coupled to said triggering circuit, wherein said edge suppressor circuit is adapted to receive said first output signal, said edge suppressor circuit adapted to provide a positive step signal as a second output signal, and wherein said edge suppressor circuit includes combinational means for logically combining said first output signal and said second output signal to produce a third output signal; and an output node for outputting said third output signal.

In a second general aspect, the present invention presents a method for reducing lock time in a delay locked loop (DLL), said method comprising: providing an input node for receiving an input signal, wherein said input signal is a clock signal; providing a triggering circuit, said triggering circuit operationally coupled to said input node, wherein said triggering circuit is adapted to condition said input signal and to provide a first output signal in response to a threshold level being reached by said input signal; providing an edge suppressor circuit operationally coupled to said triggering circuit, wherein said edge suppressor circuit is adapted to receive said first output signal, said edge suppressor circuit adapted to provide a positive step signal as a second output signal, and wherein said edge suppressor circuit includes combinational means for logically combining said first output signal and said second output signal to produce a third output signal; and providing an output node for outputting said third output signal.

In a third general aspect, the present invention presents a semiconductor device with a synchronous memory component, said semiconductor device comprising: a reference clock signal applied to said synchronous memory component; and a coarse delay tuner circuit for reducing lock time in said synchronous memory component.

In a fourth general aspect, the present invention presents a method of providing synchronization in a semiconductor device having a synchronous memory device, said method comprising: providing a reference clock signal applied to said synchronous memory device; and providing a coarse delay tuner circuit for reducing lock time in said synchronous memory component.

In a fifth general aspect, the present invention presents an apparatus containing a synchronous integrated circuit, said apparatus comprising: a synchronous memory component; a reference clock signal applied to said synchronous memory component; and a delay locked loop, wherein said delay locked loop includes edge suppressor means for reducing lock time in said synchronous memory component.

The foregoing and other features and advantages of the invention will be apparent from the following more particular description of embodiments of the invention. It is to be understood that both the foregoing general description and the following detailed description are exemplary, but are not restrictive, of the invention.

The features and inventive aspects of the present invention will become more apparent upon reading the following detailed description, claims and drawings, of which the following is a brief description.

The following is a detailed explanation of the structure and method for a coarse delay tuner circuit which may be employed in DLLs for reducing the lock time, according to the present invention. It should be noted that the same reference numbers are assigned to components having approximately the same functions and structural features in the following explanation and the attached drawings to preclude the necessity for repeated explanation thereof.

Many digital systems rely on accurate clocks to synchronize the timing of operations and data transfers. A crystal oscillator is often used to generate a reference clock signal at some base frequency. This clock signal is then divided or multiplied to create one or more clock signals with desired frequencies. Alternatively, external clock signals can be received and likewise divided or multiplied to produce internal clocks. Delay locked loops (DLLs) and phase locked loops (PLLs) have become mandatory in these synchronous integrated circuits (ICs) to prevent clock skew, that is, the comparative difference between the phase and frequency of a reference clock signal, when compared with the phase and frequency of a feedback clock signal. When the difference between the phase and frequency is essentially zero, or within some specified tolerance, a "lock" is achieved. Minimizing the time required to achieve this DLL lock, i.e., the lock time, is an increasingly challenging proposition, particularly with DLLs in deep sub-micron integrated circuit chips.

Figure 1:
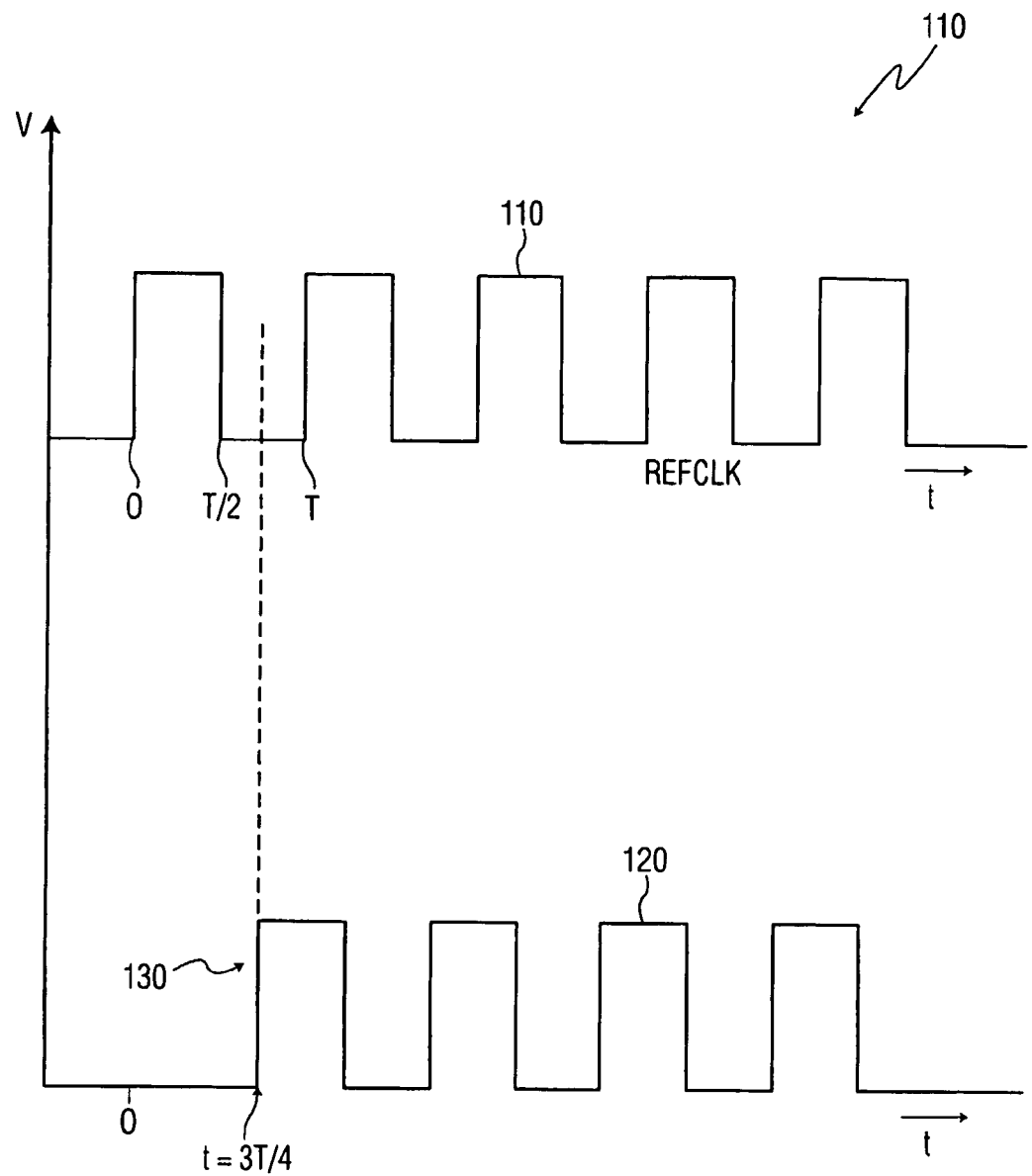
FIG. 1 is a timing diagram representing a reference clock (REFCLK) signal and a corresponding coarse tuning circuit output signal in accordance with an embodiment of the related art.

One way to ensure a lock, and to also have reduced lock time, is to use a coarse delay tuner circuit. A DLL without such a coarse delay tuner circuit results in the lock time of the DLL being relatively high, and sometimes the locking process gets tedious. A typical coarse delay tuner circuit operates by shifting the rising edge of the incoming clock pulse by a large step. For example, in the timing diagram 100 of FIG. 1, a first signal tracel 10, is shown. First signal trace 110 represents the incoming reference clock signal REFCLK. The second signal trace 120 represents the output of the coarse delay tuner circuit, and indicates that the first rising edge 130 occurs at a time equal to some fraction of the period T of the first signal trace 110, REFCLK. For illustrative purposes, the fractional amount may be ¾, corresponding to the first rising edge occurring at the time of 3T/4.

A coarse delay tuning circuit, for use in a DLL, includes a chain of inverters which provide the required time delay. The required number of inverters can be calculated with the following formula:

total delay=delay per inverter (*d*)\*number of inverters (*n*)

In the instant case, the total desired delay is 3T/4, so 3T/4=d\*n

Alternatively, number of inverters (n)=total delay/delay per inverter=3T/(4d). Typically, this number is on the order of a few hundreds, and such a large number of inverters then additionally necessitates the use of one or more decoders to dynamically select the number of inverters required at any moment.

Figure 2:
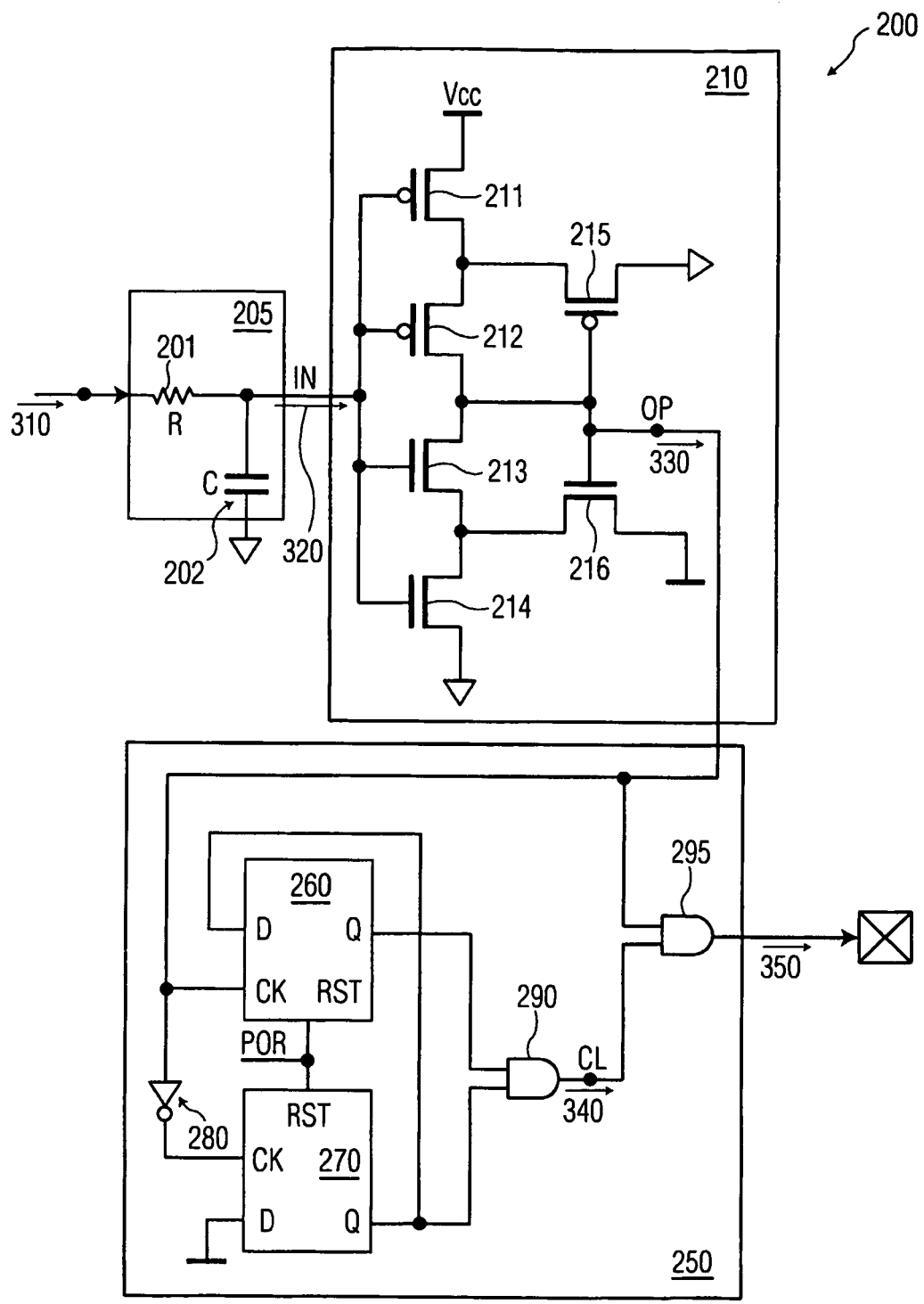
FIG. 2 is an electrical schematic diagram of a coarse delay tuner with an edge suppressor in accordance with an embodiment of the present invention.

Referring now to FIG. 2, an electrical schematic diagram of a coarse delay tuner circuit in combination with an edge suppressor circuit in accordance with an embodiment of the present invention is shown. The coarse delay tuner circuit 200 includes a low pass filter circuit 205, a Schmitt trigger circuit 210 and an edge suppressor circuit 250.

The low pass filter circuit 205 may be, inter alia, a first order R-C network, comprised of resistor 201 and capacitor 202, or it may be any other suitable signal conditioning circuit suited to modifying the input signal to the required format. The input to the low pass filter circuit 205 is the REFCLK signal which is the incoming reference clock signal. The REFCLK signal is integrated (i.e., a ramping signal is produced) by the low pass filter circuit 205, resulting in a repeatedly ramping signal at the input node IN. The ramping signal at input node IN is the input to the Schmitt trigger circuit 210. In this illustrative embodiment, Schmitt trigger circuit 210 is implemented with complementary metal-oxide-semiconductor (CMOS) transistors, namely p-channel MOS (PMOS) transistors 211, 212, 215, and n-channel MOS (NMOS) transistors 213, 214, 216. Alternatively, Schmitt trigger circuit 210 may be implemented with other combinations of MOSFET's, or with BJT's. Schmitt trigger circuit 210 produces an output signal at output node OP. This output signal is then directed to edge suppressor circuit 250. Due to the inherent hysteresis operating characteristic found in Schmitt trigger circuits, the output signal at output node OP will remain in a high state until the input voltage at input node IN rises above a upper threshold voltage for the particular transistors comprising the Schmitt trigger circuit 210. When the upper threshold voltage is exceeded, the output of the Schmitt trigger circuit 210 will switch to a low state. Conversely, the output signal at node OP will remain in a low state until the input voltage at node IN drops below the lower threshold voltage to switch the output voltage at node OP to a high state.

Generally, Schmitt trigger circuit operation is known. More specifically, in an embodiment of the present invention, the Schmitt trigger circuit 210 receives a ramping signal via input node IN from the low pass filter circuit 205. The ramping of the input signal at input node IN, after triggering by the Schmitt trigger circuit 210 at appropriate threshold levels, produces a string of output pulses from the Schmitt trigger circuit 210 at output node OP. Alternatively, the Schmitt trigger circuit 210 may be replaced by another suitable triggering circuit, such as, inter alia, a Zener diode circuit.

The output pulses from output node OP are fed as the input to the edge suppressor circuit 250, which comprises D-flipflops 260, 270, an inverter 280, and combinational means such as, inter alia, a pair of two-input NAND gates 290, 295. Edge suppressor circuit 250 may be constructed using CMOS transistor technology, or other suitable technologies may be employed.

The D-flipflops 260, 270 are resettable, and positive edge triggered. As is known, each D-flipflop comprises a data input (D), a clock input (CK), an output Q, and a reset or enable input (RST). Here, the power-on reset signal (POR) is used in resetting the output of the D flipflops 260, 270 to zero. In operation, as the output pulse from the Schmitt trigger circuit 210 is passed to the edge suppressor circuit 250, a positive voltage step is produced at the output of NAND gate 290, at node CL.

Figure 3:
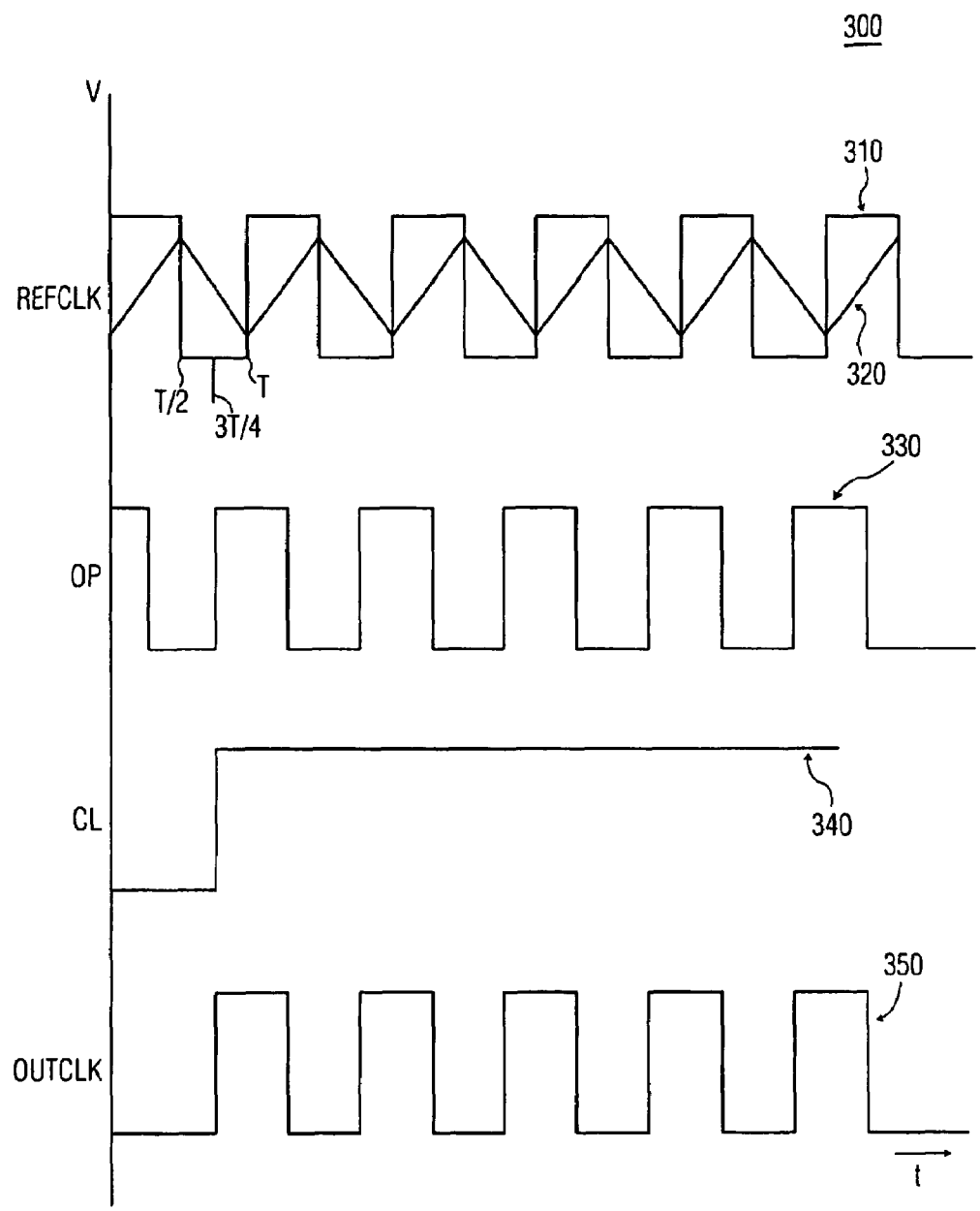
FIG. 3 is a timing diagram representing the status of various signals at different nodes of the circuit of FIG. 2 in accordance with an embodiment of the present invention.

This positive step at node CL, when logically ANDed with the signal from output node OP of the Schmitt trigger circuit 210, at NAND gate 295, produces the output clock signal OUTCLK. In this illustrative example, output signal OUTCLK has its first rising edge at time t=3T/4 of the original incoming input REFCLK signal. Thus, the coarse delay tuner circuit 200 shifts the rising edge of the incoming clock signal REFCLK by 3T/4, or approximately 75% of the period T of the REFCLK signal. The functionality of the coarse delay tuner circuit 200 can be further explained via the timing diagram of FIG. 3. FIG. 3 is a timing diagram of the square wave, original input REFCLK signal 310, and the ramping signal 320 at the node IN, which is the input to the coarse delay tuner circuit 200. Also shown are the Schmitt trigger circuit 210 output signal 330 at node OP, the positive step signal 340 at node CL of the edge suppressor circuit 250, and the output signal 350 at node OUTCLK.

As FIG. 3 shows, the output signal 350 of node OUTCLK has its first rising edge at time t=3T/4 of the REFCLK signal, where T is the period of the REFCLK signal. Embodiments of the present invention have been disclosed. A person of ordinary skill in the art would realize, however, that certain modifications would come within the teachings of this invention. For example, rather than the particular transistor technology represented by the embodiment discussed herein regarding FIG. 2, the present invention also encompasses embodiments incorporating other transistor technologies. Similarly, inversions of the signals may be included. Therefore, the following claims should be studied to determine the true scope and content of the invention.

The invention claimed is:

1. A coarse delay tuner circuit for use with delay locked loops, said coarse delay tuner circuit comprising: an input node for receiving an input signal, wherein said input signal is a clock signal; a triggering circuit, said triggering circuit operationally coupled to said input node, wherein said triggering circuit conditions said input signal and to provides a first output signal in response to a threshold level being reached by said input signal; an edge suppressor circuit operationally coupled to said triggering circuit, wherein said edge suppressor circuit receives said first output signal, said edge suppressor circuit providinge a positive step signal as a second output signal, and wherein said edge suppressor circuit includes combinational means for logically combining said first output signal and said second output signal to produce a third output signal; and an output node for outputting said third output signal.

2. The coarse delay tuner circuit of claim 1, further comprising a signal conditioning circuit operationally connected to said input node, said signal conditioning circuit preparing said input signal for use by said triggering circuit.

3. The coarse delay tuner circuit of claim 2, wherein said signal conditioning circuit is a low pass filter circuit.

4. The coarse delay tuner circuit of claim 3, wherein said low pass filter circuit is a first order R-C network.

5. The coarse delay tuner circuit of claim 1, wherein said triggering circuit is a Schmitt trigger circuit.

6. The coarse delay tuner circuit of claim 1, wherein said edge suppressor circuit further comprises: a first D-flipflop, said first D-flipflop having a clock input connected to said first output signal, a data input, a reset input connected to a power on reset signal, and an output connected to a first input of a first NAND gate; an inverter connected to said first output signal for producing an inverted input signal; a second D-flipflop, said second D-flipflop having a clock input connected to said inverted input signal, a data input connected to a power supply, a reset input connected to said power on reset signal, and an output connected to a second input of said first NAND gate, and to said data input of said first D-flip-flop; said first NAND gate having an output connected to a second input of a second NAND gate; and said second NAND gate having a first input connected to said first output signal, and said second NAND gate having an output for providing said third output signal.

7. The coarse delay tuner circuit of claim 1, wherein said clock signal has a rising edge and a period, and said third output signal has a rising edge with a delay of about 75% of said period relative to the clock signal.

8. A method for reducing lock time in a delay locked loop (DLL), said method comprising: providing an input node for receiving an input signal, wherein said input signal is a clock signal; providing a triggering circuit, said triggering circuit operationally coupled to said input node, wherein said triggering circuit conditions said input signal and provides a first output signal in response to a threshold level being reached by said input signal; providing an edge suppressor circuit operationally coupled to said triggering circuit, wherein said edge suppressor circuit receives said first output signal, said edge suppressor circuit providinge a positive step signal as a second output signal, and wherein said edge suppressor circuit includes combinational means for logically combining said first output signal and said second output signal to produce a third output signal; and providing an output node for outputting said third output signal.

9. The method of claim 8, further comprising a signal conditioning circuit operationally connected to said input node, said signal conditioning circuit preparinge said input signal for use by said triggering circuit.

10. The method of claim 9, wherein said signal conditioning circuit is a low pass filter circuit.

11. The method of claim 10, wherein said low pass filter circuit is a first order R-C network.

12. The method of claim 8, wherein said triggering circuit is a Schmitt trigger circuit.

13. The method of claim 8, wherein said edge suppressor circuit further comprises: a first D-flipflop, said first D-flipflap having a clock input connected to said first output signal, a data input, a reset input connected to a power on reset signal, and an output connected to a first input of a first NAND gate; an inverter connected to said first output signal for producing an inverted input signal; a second D-flipflop, said second D-flipflop having a clock input connected to said inverted input signal, a data input connected to a power supply, a reset input connected to said power on reset signal, and an output connected to a second input of said first NAND gate, and to said data input of said first D-flip-flop; said first NAND gate having an output connected to a second input of a second NAND gate; and said second NAND gate having a first input connected to said first output signal, and said second NAND gate having an output for outputting said third output signal.

14. The method of claim 8, wherein said clock signal has a rising edge and a period, and said third output signal has a rising edge with a delay of about 75% of said period relative to the clock signal.

* * * * *